US012772721B2

(12) United States Patent
Shukuri

(10) Patent No.: US 12,772,721 B2
(45) **Date of Patent: *Oct. 20, 2026**

(54) LIGHT-EMITTING DEVICE, DISPLAY DEVICE, PHOTOELECTRIC CONVERSION DEVICE, AND ELECTRONIC APPARATUS

(71) Applicant: CANON KABUSHIKI KAISHA, Tokyo (JP)

(72) Inventor: Hirotaka Shukuri, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/978,200

(22) Filed: Dec. 12, 2024

(65) Prior Publication Data

US 2025/0113721 A1 Apr. 3, 2025

Related U.S. Application Data

(63) Continuation of application No. 18/325,297, filed on May 30, 2023, now Pat. No. 12,207,529.

(30) Foreign Application Priority Data

Jun. 13, 2022 (JP) ................................ 2022-095221

(51) Int. Cl.
*G09G 3/36* (2006.01)
*G01K 3/14* (2006.01)
(Continued)

(52) U.S. Cl.
CPC ............... *H10K 59/90* (2023.02); *G01K 3/14* (2013.01); *G09G 3/3225* (2013.01);
(Continued)

(58) Field of Classification Search
CPC .......... H10K 59/90; H10N 19/00; G01K 3/14; G09G 2320/041; G09G 2340/04; G02F 1/1368
See application file for complete search history.

(56) References Cited

U.S. PATENT DOCUMENTS 8,730,219 B2 5/2014 Kohtoku
9,858,891 B2 1/2018 Ohe
(Continued)

FOREIGN PATENT DOCUMENTS

CN 113270070 A 8/2021
CN 114495823 A 5/2022
(Continued)

OTHER PUBLICATIONS

Apr. 24, 2026 Japanese Official Action in Japanese Patent Appln. No. 2022-095221.

*Primary Examiner* — Abdul-Samad A Adediran
(74) *Attorney, Agent, or Firm* — Venable LLP

(57) ABSTRACT

A light-emitting device in which are stacked (1) a first substrate including a light-emitting area where a plurality of light-emitting elements are arranged and (2) a second substrate where a first temperature detector configured to detect a temperature of the first substrate is arranged, is provided. The first temperature detector has a temperature dependence. In an orthogonal projection with respect to a main surface of the first substrate where the light-emitting area is arranged, the first temperature detector is arranged in an overlapping area of the second substrate overlapping the light-emitting area.

20 Claims, 11 Drawing Sheets

(51) Int. Cl.
*G09G 3/3225* (2016.01)
*H10K 59/90* (2023.01)
*H10N 19/00* (2023.01)

(52) U.S. Cl.
CPC ....... *H10N 19/00* (2023.02); *G09G 2320/041* (2013.01); *G09G 2340/04* (2013.01)

(56) References Cited

U.S. PATENT DOCUMENTS

| | | | | |
|---|---|---|---|---|
| 12,207,529 | B2 | 1/2025 | Shukuri | |
| 2008/0245949 | A1 | 10/2008 | Morimoto | |
| 2012/0212467 | A1 | 8/2012 | Kohtoku | |
| 2013/0321387 | A1 | 12/2013 | Ohe | |
| 2021/0048860 | A1 * | 2/2021 | Jinta | G02F 1/1368 |
| 2023/0137579 | A1 | 5/2023 | Wu | |

FOREIGN PATENT DOCUMENTS

| | | | |
|---|---|---|---|
| JP | 2001-236040 | A | 8/2001 |
| JP | 2008-175958 | A | 7/2008 |
| JP | 2008-185671 | A | 8/2008 |
| JP | 2010-272788 | A | 12/2010 |
| JP | 2013-250475 | A | 12/2013 |
| WO | 2011/052331 | A1 | 5/2011 |

* cited by examiner

LIGHT-EMITTING DEVICE, DISPLAY DEVICE, PHOTOELECTRIC CONVERSION DEVICE, AND ELECTRONIC APPARATUS

This application is a continuation of application Ser. No. 18/325,297 filed May 30, 2023.

BACKGROUND OF THE INVENTION

Field of the Invention

The present invention relates to a light emitting device, a display device, a photoelectric conversion device, and an electronic apparatus.

Description of the Related Art

The light emission characteristic of a self-light emitting element such as an organic electroluminescence (EL) element has temperature dependence. Japanese Patent Laid-Open No. 2001-236040 describes that a sensor element for measuring temperature is arranged in a display area where the EL element is arranged.

SUMMARY OF THE INVENTION

When the sensor element is arranged in the display area, it is necessary to arrange, in the display area, not only the sensor element itself but also a wiring pattern for operating the sensor element. Hence, it is difficult to increase the resolution of the display area and reduce the size thereof.

Some embodiments of the present invention provide a technique advantageous in temperature detection.

According to some embodiments, a light emitting device in which a first substrate including a light emitting area where a plurality of light emitting elements are arranged and a second substrate where a temperature detector configured to detect a temperature of the first substrate is arranged are stacked, wherein in an orthogonal projection with respect to a main surface of the first substrate where the light emitting area is arranged, the temperature detector is arranged in an overlapping area of the second substrate overlapping the light emitting area, is provided.

Further features of the present invention will become apparent from the following description of exemplary embodiments (with reference to the attached drawings).

DESCRIPTION OF THE EMBODIMENTS

Figure 1:
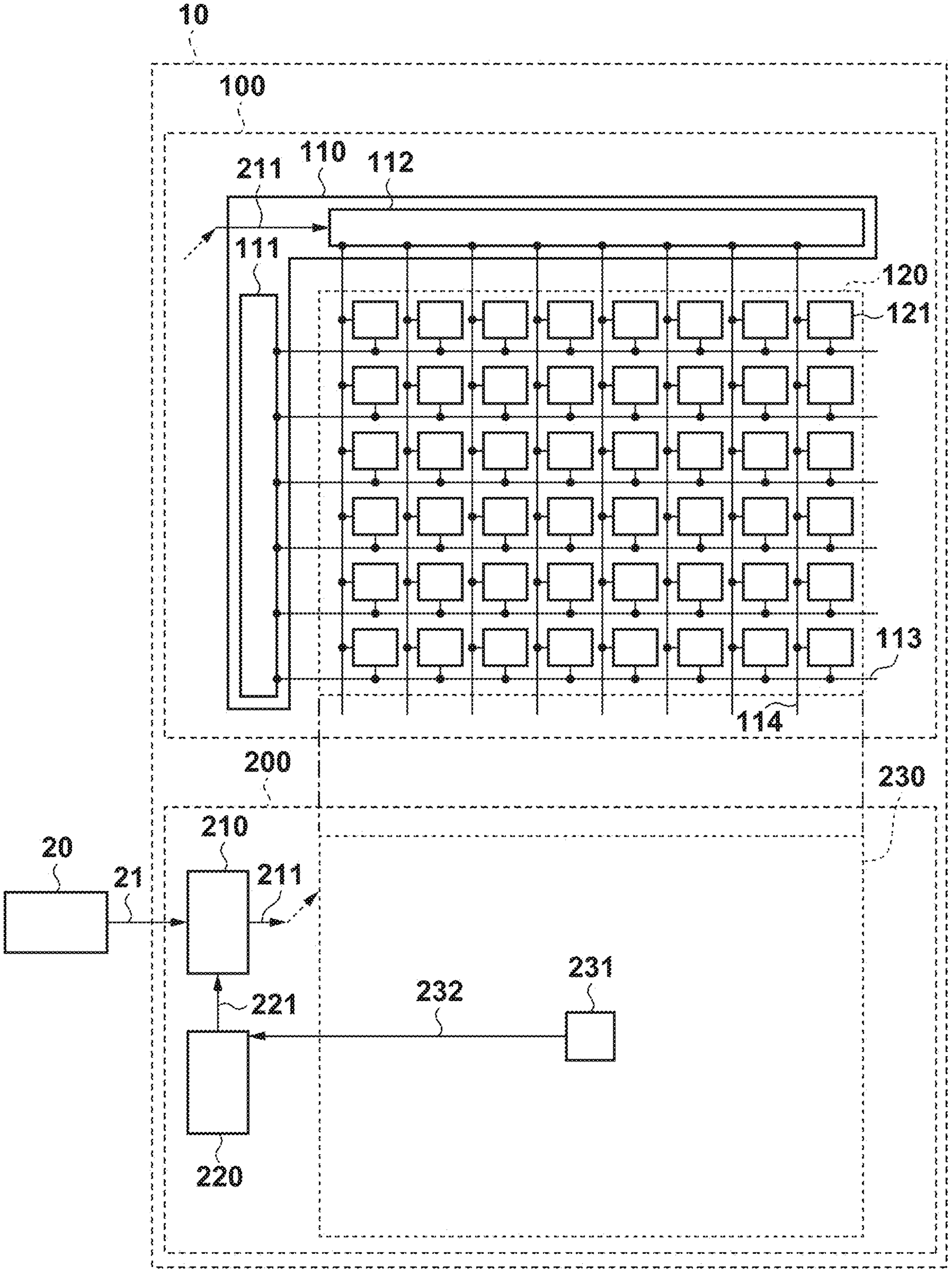
FIG. 1 is a view showing an arrangement example of a light emitting device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

With reference to FIGS. 1 to 6A and 6B, a light emitting device according to an embodiment of the present disclosure will be described. FIG. 1 is a view showing an arrangement example of a light emitting device 10 according to the embodiment. In the light emitting device 10, a substrate 100 including a light emitting area 120 where a plurality of light emitting elements 121 are arranged, and a substrate 200 where a temperature detector 231 configured to detect the temperature of the substrate 100 are stacked. A user can use the light emitting device 10 with the main surface of the light emitting device 10 including the light emitting area 120 of the substrate 100 facing the user side. An external system 20 can exist outside the light emitting device 10, and the light emitting device 10 is connected to the external system 20.

A plurality of light emitting elements 121 are arranged in the substrate 100 so as to form rows and columns. The area where the plurality of light emitting elements 121 are arranged in a two-dimensional array can be referred to as the light emitting area 120. An operation circuit 110 configured to cause each of the plurality of light emitting elements 121 arranged in the light emitting area 120 to emit light at a predetermined luminance is also arranged in the substrate 100. The operation circuit 110 includes a vertical scanning circuit 111 and a signal output circuit 112. The operations of the vertical scanning circuit 111 and the signal output circuit 112 will be described later.

As has been described above, the temperature detector 231 is arranged in the substrate 200. In an orthogonal projection with respect to the main surface of the substrate 100 where the light emitting area 120 is arranged, the temperature detector 231 is arranged in an overlapping area 230 of the substrate 200 overlapping the light emitting area 120. In the arrangement shown in FIG. 1, the temperature detector 231 is arranged in the central portion of the overlapping area 230. Here, in an orthogonal projection with respect to the main surface of the substrate 200 where the temperature detector 231 is arranged, the central portion of the overlapping area 230 can be the area having the row-direction length 20% or less the row-direction length of the overlapping area 230 and the column-direction length 20% or less the column-direction length of the overlapping area 230 with the geometric centroid position of the overlapping area 230 as the center. Alternatively, in the orthogonal projection with respect to the main surface of the substrate 200 where the temperature detector 231 is arranged, the central portion of the overlapping area 230 can be, for example, the area having the row-direction length 10% or less the row-direction length of the overlapping area 230 and the column-direction length 10% or less the column-direction length of the overlapping area 230 with the geometric centroid position of the overlapping area 230 as the center. In the arrangement shown in FIG. 1, one temperature detector 231 is arranged in the central portion of the overlapping area 230 in order to increase the number of the light emitting elements 121 that can be located close to the one temperature detector 231, thereby measuring the temperature change over the area as wide as possible.

The substrate 200 can include a drive circuit 210 and a control circuit 220 in addition to the temperature detector 231. However, the present invention is not limited to this, and at least some of the functions of the drive circuit 210 and the control circuit 220 may be mounted on the substrate 100. Further, for example, at least some of the functions of the vertical scanning circuit 111 and the signal output circuit 112 arranged in the substrate 100 may be mounted on the substrate 200. A description will be given below starting from the substrate 200 along the sequence of data processing of the light emitting device 10.

The temperature detector 231 includes a temperature sensor (not shown) using a diode or the like. The temperature detector 231 A/D-converts an output of the temperature sensor, and outputs, to the control circuit 220, temperature data 232 obtained by quantifying the temperature change from the reference temperature.

The control circuit 220 generates a correction signal 221 corresponding to the temperature data 232 detected by the temperature detector 231. For example, the control circuit 220 may hold, in an internal Look-Up Table (LUT), a gamma correction coefficient for linearly correcting the input/output characteristic of the light emitting device 10. The control circuit 220 has a function of outputting, as the correction signal, a temperature corrected coefficient obtained by correcting the gamma correction coefficient read out from the LUT in accordance with the temperature data 232. For example, the temperature corrected coefficient can be obtained by solving, for the temperature data 232, a quadratic formula approximating the temperature characteristic of the light emitting element 121. The temperature corrected coefficient obtained in this manner is output to the drive circuit 210 as the correction signal 221. In this embodiment, processing for the gamma correction coefficient has been described, but the kind of the correction coefficient to which the processing in this block can be applied is not limited thereto.

The drive circuit 210 generates, from a video signal 21 input from the external system 20 to the light emitting device 10, a drive signal for driving the plurality of light emitting elements 121. At this time, the drive signal is corrected in accordance with the correction signal 221 input from the control circuit 220. For example, the drive circuit 210 performs gamma correction, using the correction signal 221, on the video signals 21 sequentially transmitted from the external system 20, and outputs the obtained video signals to the vertical scanning circuit 111 as drive signals 211. In this embodiment, it will be described that each of one video signal 21 and one drive signal 211 includes luminance values of two light emitting elements 121 in the row direction and two light emitting elements 121 in the column direction, that is, four light emitting elements 121 in total. Along with the processing of the operation circuit 110 to be described later, these four light emitting elements 121 are simultaneously driven.

A plurality of vertical scanning lines 113 extending in the row direction are connected to the vertical scanning circuit 111. The vertical scanning circuit 111 outputs a write control signal to the vertical scanning line 113 under the control of a vertical scanning control signal input from the external system 20. In this embodiment, the write control signals are output to two vertical scanning lines 113 at the same time.

A plurality of signal output lines 114 extending in the column direction are connected to the signal output circuit 112. The signal output circuit 112 buffers, for respective columns, the drive signals 211 sequentially transmitted from the drive circuit 210 under the control of a signal output control signal input from the external system 20. Then, the signal output circuit 112 D/A-converts the drive signal 211 for each column to generate a voltage Vsig, which serves as the luminance signal corresponding to the value of the drive signal 211, and outputs the voltage Vsig to the signal output line 114 extending in the column direction. In this embodiment, the signal output circuit 112 simultaneously outputs the voltages Vsig to two signal output lines 114.

Each light emitting element 121 is arranged at each intersection of the vertical scanning line 113 and the signal output line 114, and each of the vertical scanning line 113 and the signal output line 114 is connected to the light emitting element 121. When the voltage Vsig is supplied, the light emitting element 121 emits light at a predetermined luminance. In the arrangement shown in FIG. 1, the light emitting area 120 including eight light emitting elements 121 in the row direction and six light emitting elements 121 in the column direction is exemplarily shown, but the number of the light emitting elements 121 is not limited to this. For example, more light emitting elements 121 can be arranged in the light emitting area 120. In addition, in this specification, as has been described above, the extending direction of the vertical scanning line 113 (the horizontal direction in FIG. 1) is defined as the row direction, and the extending direction of the signal output line 114 (the vertical direction in FIG. 1) is defined as the column direction, but the present invention is not limited to this. The extending direction of the vertical scanning line 113 may be defined as the column direction, and the extending direction of the signal output line 114 may be defined as the row direction.

In this embodiment, the temperature detector 231 is arranged not in the substrate 100 arranged with the light emitting elements 121 but in the substrate 200 stacked on the substrate 100. Therefore, as compared to a case in which the temperature detector 231 is arranged in the substrate 100, this has the effect of not increasing the pitch for arranging the light emitting elements 121 in the substrate 100. That is, it is possible to increase the resolution of the light emitting area 120. Further, by arranging the temperature detector 231 in the overlapping area 230, the distance between the temperature detector 231 and the light emitting element 121, whose light emission characteristic has temperature dependence and which also serves as a heat source, can be decreased. As a result, the temperature measurement accuracy improves. At this time, no other substrate may be arranged between the substrate 100 and the substrate 200. In addition, by arranging the temperature detector 231 in the overlapping area 230, the light emitting device 10 can be downsized. In this manner, it is possible to obtain the light emitting device 10 that can accurately detect the temperature of the light emitting area 120 while increasing the resolution of the light emitting area 120 and reducing the size thereof. Thus, improvement of the display quality of the light emitting device 10 is achieved.

Figure 2:
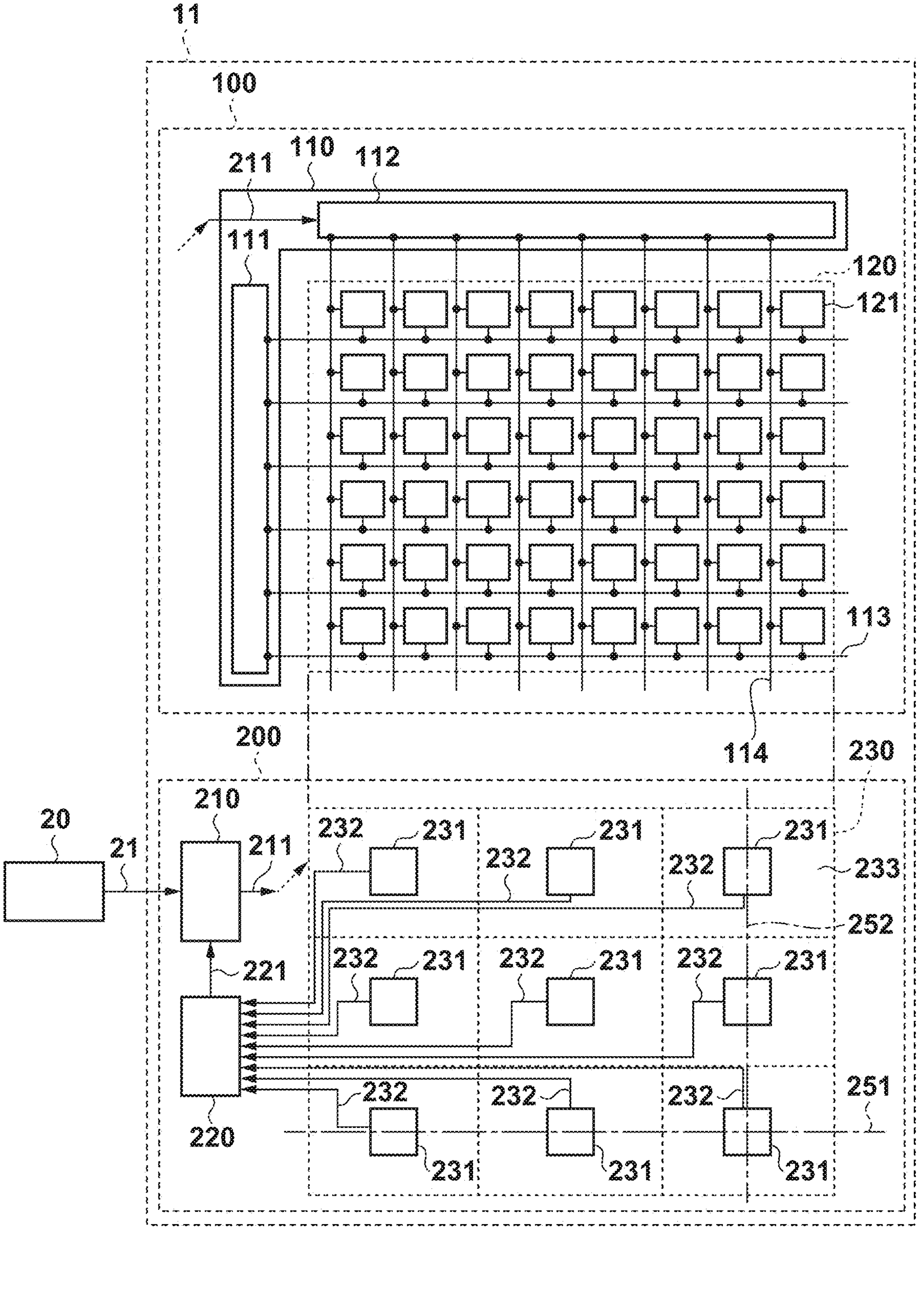
FIG. 2 is a view showing a modification of the light emitting device shown in FIG. 1.

FIG. 2 is a view showing a modification of the light emitting device 10 shown in FIG. 1. A light emitting device 11 in this embodiment is different from the light emitting device 10 described above in the number of the temperature detectors 231 arranged in the overlapping area 230, the number of the temperature data 232 input from the temperature detectors 231 to the control circuit 220, and the generation method of the correction signal 221 in the control circuit 220. The arrangement of the light emitting device 11 except for these points may be similar to the arrangement of the light emitting device 10 described above. Hence, differences from the light emitting device 10 will mainly be described, and a description of points that may be similar to those of the light emitting device 10 will be omitted as appropriate.

As shown in FIG. 2, in the light emitting device 11, a plurality of the temperature detectors 231 are arranged in the overlapping area 230. For example, as shown in FIG. 2, the temperature detector 231 may be arranged in each of a plurality of areas 233 obtained by dividing the overlapping area 230 equally in the row direction and equally in the column direction. In other words, among the plurality of the temperature detectors 231, the temperature detectors 231 arranged on one virtual line 251 along the row direction may be arranged at a constant pitch. Similarly, among the plurality of the temperature detectors 231, the temperature detectors 231 arranged on one virtual line 252 along the column direction may be arranged at a constant pitch.

Each of the plurality of the temperature detectors 231 outputs the detected temperature data 232 to the control circuit 220. The control circuit 220 generates the correction signal 221 in accordance with a plurality of the temperature data 232 detected by the plurality of the temperature detectors 231. For example, the control circuit 220 may calculate the above-described temperature corrected coefficient based on the average value of the plurality of the temperature data 232, and output the temperature corrected coefficient to the drive circuit 210 as the correction signal 221. In accordance with the correction signal 221 input from the control circuit 220, the drive circuit 210 corrects the drive signal corresponding to the video signal 21 input from the external system 20, and outputs the corrected drive signal to the vertical scanning circuit 111 as the drive signal 211.

As compared to the light emitting device 10 shown in FIG. 1, the light emitting device 11 shown in FIG. 2 includes the plurality of the temperature detectors 231 in the overlapping area 230. With this arrangement, the number of the light emitting elements 121, which also serve as heat sources located close to the temperature detectors 231, increases, so that the temperature measurement accuracy improves. Further, the correction signal 221 is generated from the plurality of the temperature data 232. For example, the control circuit 220 generates the correction signal 221 based on the average value of the plurality of the temperature data 232 detected by the plurality of the temperature detectors 231. Therefore, it is possible to reduce the influence of the error of each temperature detector 231 and the like. As a result, the light emitting device 11 can improve the temperature measurement accuracy as compared to the light emitting device 10.

Figure 3:
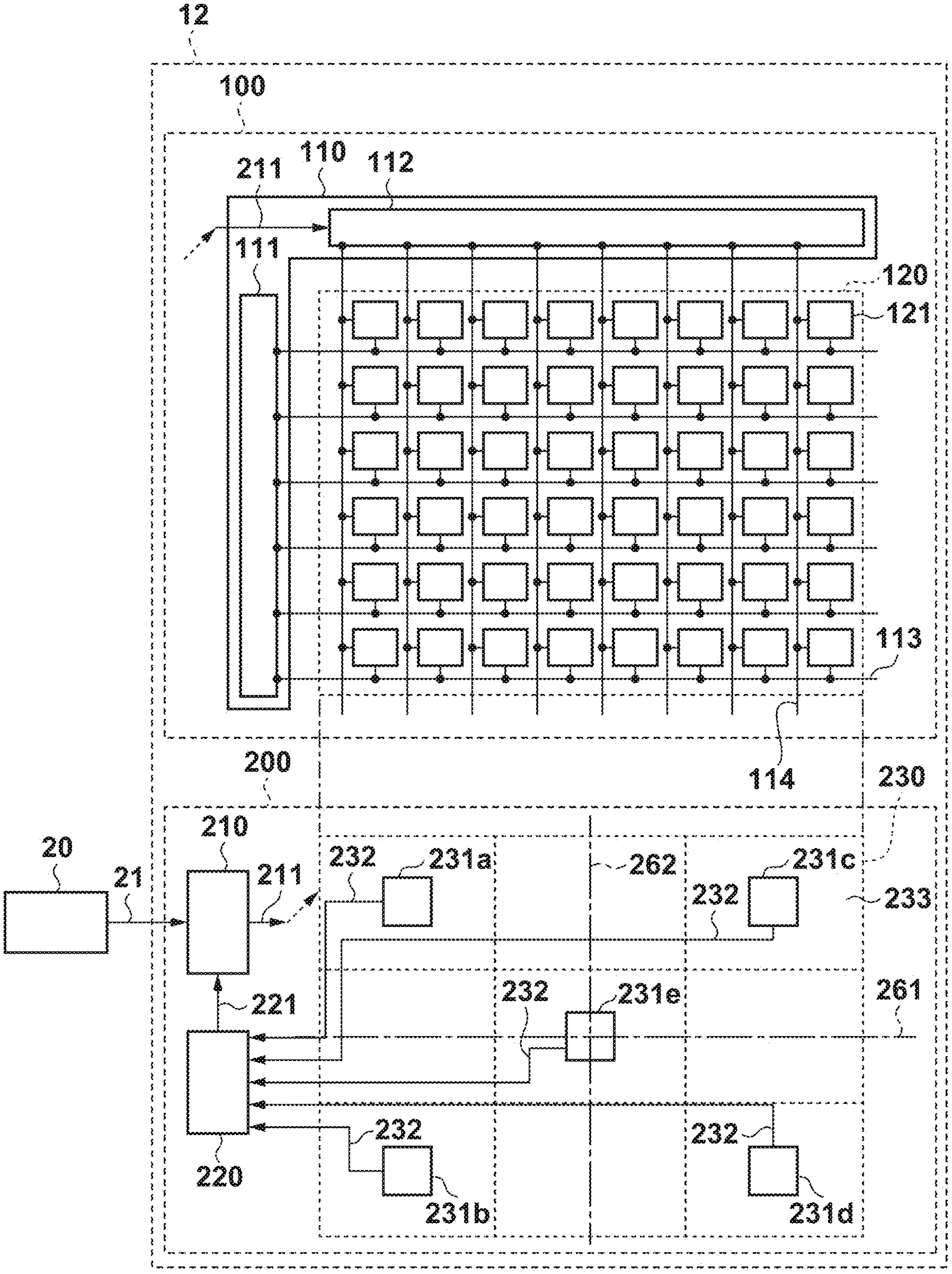
FIG. 3 is a view showing another modification of the light emitting device shown in FIG. 1.

FIG. 3 is a view showing another modification of the light emitting device 11 shown in FIG. 2. A light emitting device 12 in this embodiment is different from the light emitting device 11 described above in the number of the temperature detectors 231 arranged in the overlapping area 230, and the number of the temperature data 232 input from the temperature detectors 231 to the control circuit 220. The arrangement of the light emitting device 12 except for these points may be similar to the arrangement of the light emitting device 11 described above. Hence, differences from the light emitting device 11 will mainly be described, and a description of points that may be similar to those of the light emitting device 11 will be omitted as appropriate.

In the light emitting device 11, one temperature detector 231 is arranged in each of the plurality of areas 233 obtained by dividing the overlapping area 230 equally in the row direction and equally in the column direction. On the other hand, in the light emitting device 12, no temperature detector 231 is arranged in some areas 233. More specifically, the plurality of the temperature detectors 231 include five temperature detectors 231 arranged in the central portion and four corners of the overlapping area 230. At this time, as shown in FIG. 3, the plurality of the temperature detectors 231 may include two temperature detectors 231 (each of a combination of temperature detectors 231*a* and 231*b* and a combination of temperature detectors 231*c* and 231*d*) arranged at positions line-symmetric with respect to a virtual line 261 extending in the row direction and halving the overlapping area 230. Similarly, the plurality of the temperature detectors 231 may include two temperature detectors 231 (each of a combination of the temperature detectors 231*a* and 231*c* and a combination of the temperature detectors 231*b* and 231*d*) arranged at positions line-symmetric with respect to a virtual line 262 extending in the column direction and halving the overlapping area 230. In addition, in the arrangement shown in FIG. 3, the plurality of the temperature detectors 231 further include a temperature detector 231*e* arranged in the central portion of the overlapping area 230.

As compared to the light emitting device 11 shown in FIG. 2, in the light emitting device 12 shown in FIG. 3, the temperature detectors 231 arranged in the overlapping area 230 are appropriately thinned out. However, since the plurality of the temperature detectors 231 are arranged, the temperature measurement accuracy can be improved as in the light emitting device 11. In addition, since the number of the temperature detectors 231 arranged in the substrate 200 is smaller than in the light emitting device 11, processing blocks other than the temperature detectors 231 can be arranged in the overlapping area 230. This has an effect of downsizing the light emitting device 12.

An example has been described in which, in the arrangement shown in FIG. 3, the overlapping area 230 is divided into nine areas 233 and the temperature detectors 231 are arranged in five areas 233 in the central portion and four corners. However, the present invention is not limited to this. The overlapping area 230 may be divided into more areas 233, and the temperature detectors 231 may be arranged as appropriate. At this time, as has been described above, by arranging the temperature detectors 231 at positions line-symmetric with respect to the virtual lines 261 and 262, the temperature can be detected more uniformly in the overlapping area 230. Further, for example, two temperature detectors 231 may be arranged at positions point-symmetric with respect to the center of the overlapping area 230.

Figure 4:
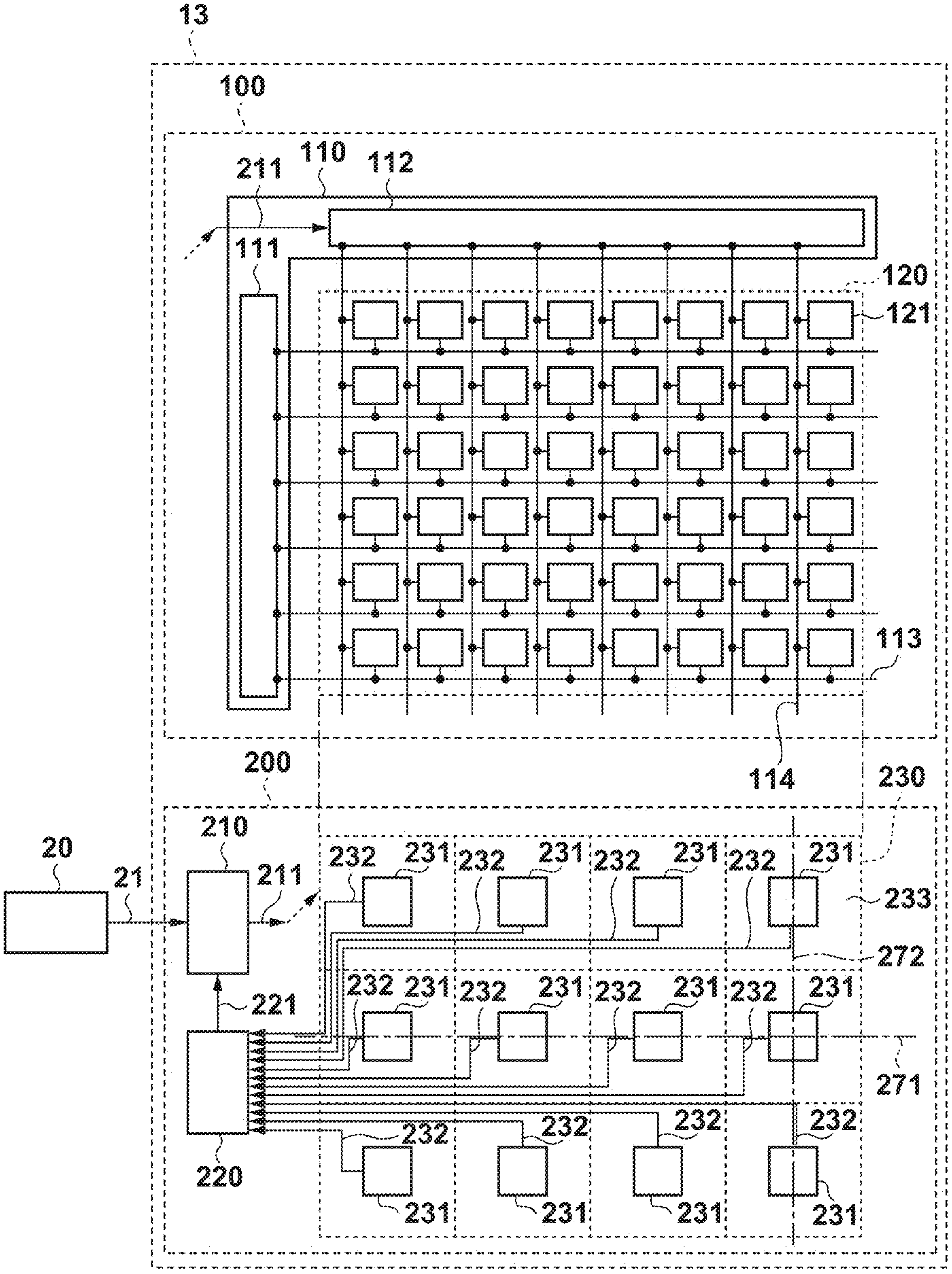
FIG. 4 is a view showing still another modification of the light emitting device shown in FIG. 1.

FIG. 4 is a view showing still another modification of the light emitting device 11 shown in FIG. 2. A light emitting device 13 in this embodiment is different from the light emitting device 11 described above in the number of the temperature detectors 231 arranged in the overlapping area

230, the number of the temperature data 232 input from the temperature detectors 231 to the control circuit 220, and the generation method of the correction signal 221 in the control circuit 220. The arrangement of the light emitting device 13 except for these points may be similar to the arrangement of the light emitting device 11 described above. Hence, differences from the light emitting device 11 will mainly be described, and a description of points that may be similar to those of the light emitting device 11 will be omitted as appropriate.

It has been described that in the light emitting device 11, the control circuit 220 generates the correction signal 221 based on the average value of the plurality of the temperature data 232 detected by the plurality of the temperature detectors 231. On the other hand, in the light emitting device 13, the control circuit 220 generates the correction signal 221 based on, among the plurality of the temperature data 232 detected by the plurality of the temperature detectors 231, the temperature data corresponding to the position of the light emitting element 121 for which the drive circuit 210 generates the drive signal 211. The arrangement and operation of the light emitting device 13 will be described below in detail.

Assume that in the light emitting device 13, m light emitting elements 121 are arranged in the row direction in the light emitting area 120, and the drive circuit 210 simultaneously supplies the drive signal 211 to n light emitting elements 121 in the row direction among the plurality of the light emitting elements 121. At this time, among the plurality of the temperature detectors 231, the temperature detectors 231 arranged on one virtual line 271 along the row direction are respectively arranged in the areas obtained by equally dividing the overlapping area 230 into (m/n) areas in the row direction. Similarly, assume that p light emitting elements 121 are arranged in the column direction in the light emitting area 120, and the drive circuit 210 simultaneously supplies the drive signal 211 to q light emitting elements 121 in the column direction among the plurality of the light emitting elements 121. At this time, among the plurality of the temperature detectors 231, the temperature detectors 231 arranged on one virtual line 272 along the column direction are respectively arranged in the areas obtained by equally dividing the overlapping area 230 into (p/q) areas in the column direction.

As has been described above, two light emitting elements 121 in the row direction and two light emitting elements 121 in the column direction, that is, four light emitting elements 121 in total are simultaneously driven. In addition, in the arrangement shown in FIG. 4, eight light emitting elements 121 are arranged in the row direction and six light emitting elements 121 are arranged in the column direction in the light emitting area 120. Therefore, the temperature detector 231 is arranged in each of the areas 233 obtained by equally dividing the overlapping area 230 into four areas ((8/2) areas) in the row direction and three areas ((6/2) areas) in the column direction. The temperature data 232 is transmitted from the temperature detector 231 arranged in each area 233 to the control circuit 220. As shown in FIG. 4, among the plurality of the temperature detectors 231, the temperature detectors 231 arranged on one virtual line 271 along the row direction may be arranged at a constant pitch. Further, among the plurality of the temperature detectors 231, the temperature detectors 231 arranged on one virtual line 272 along the column direction may be arranged at a constant pitch.

Then, the control circuit 220 calculates, from the plurality of the temperature data 232, the temperature corrected coefficient corresponding to the temperature distribution of the overlapping area 230. More specifically, the control circuit 220 selects, from the plurality of the temperature data 232, one temperature data 232 of the temperature detector 231 arranged in the area 233 close to the light emitting element 121 to be driven next by the drive circuit 210 via the operation circuit 110, calculates the temperature corrected coefficient from the selected temperature data 232, and outputs the calculated coefficient to the drive circuit 210 as the correction signal 221. The point of this embodiment is the above-described arrangement of the temperature detectors 231, in other words, the method of setting the areas 233. If the temperature detectors 231 are not arranged as in this embodiment, it can be difficult to apply processing in accordance with the temperature distribution of the light emitting area 120. This point will be described below in detail.

Figure 5:
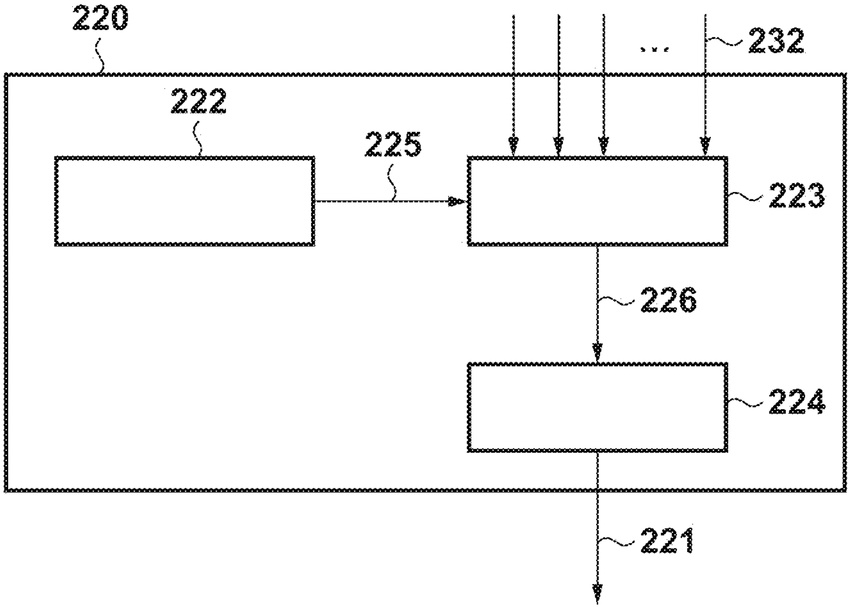
FIG. 5 is a view showing an arrangement example of the control circuit of the light emitting device shown in FIG. 4.

FIG. 5 is a view showing an arrangement example of the control circuit 220 of the light emitting device 13. A count circuit 222 counts the number of times of transmission of the signal output control signal from the external system 20 to the signal output circuit 112, and outputs it as drive element position information 225 to a temperature data control circuit 223. The temperature data control circuit 223 includes a multiplexer in which the drive element position information 225 is input to a selection signal terminal and the plurality of the temperature data 232 are respectively input to input signal terminals. The temperature data control circuit 223 outputs the output signal of the multiplexer to a correction signal generation circuit 224 as selected temperature data 226. The correction signal generation circuit 224 calculates the above-described temperature corrected coefficient from the selected temperature data 226, and outputs the calculated coefficient to the drive circuit 210 as the correction signal 221. With the processing described above, the control circuit 220 selects, from the plurality of the temperature data 232 respectively output from the plurality of the temperature detectors 231, one temperature data 232 of the temperature detector 231 arranged in the area 233 close to the light emitting element 121 to be driven next. For example, the control circuit 220 can select, from the plurality of the temperature data 232 respectively output from the plurality of the temperature detectors 231, the temperature data 232 of the temperature detector 231 arranged in the area 233 closest to the light emitting element 121 to be driven next.

Figure 6B:
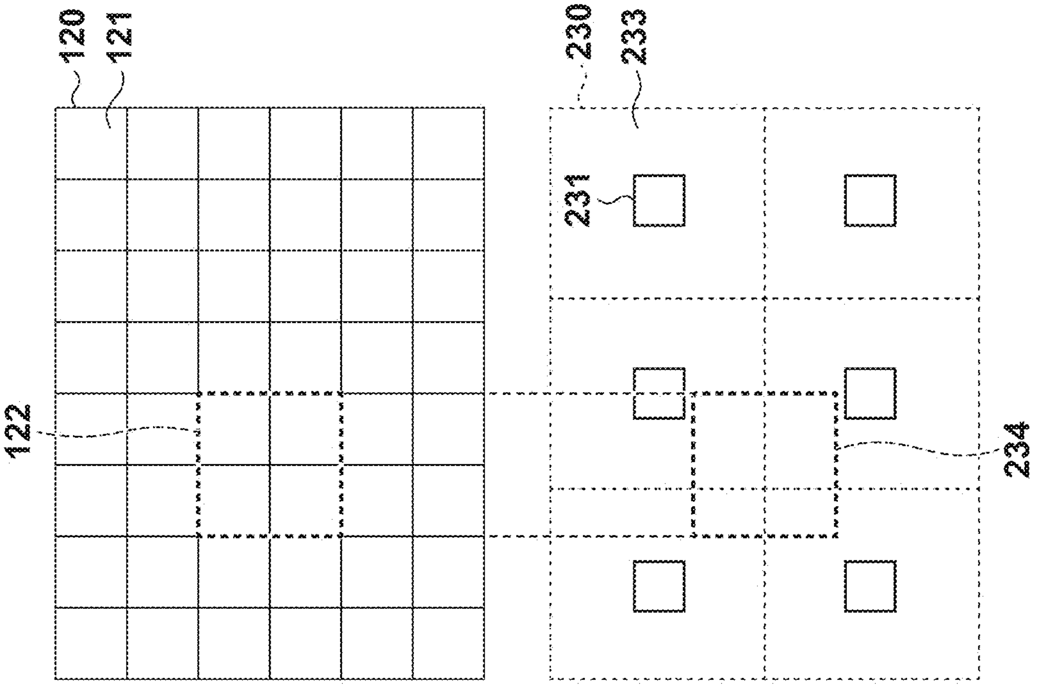
FIGS. 6A and 6B are views for explaining the operation of the light emitting device shown in FIG. 4.
Figure 6A:
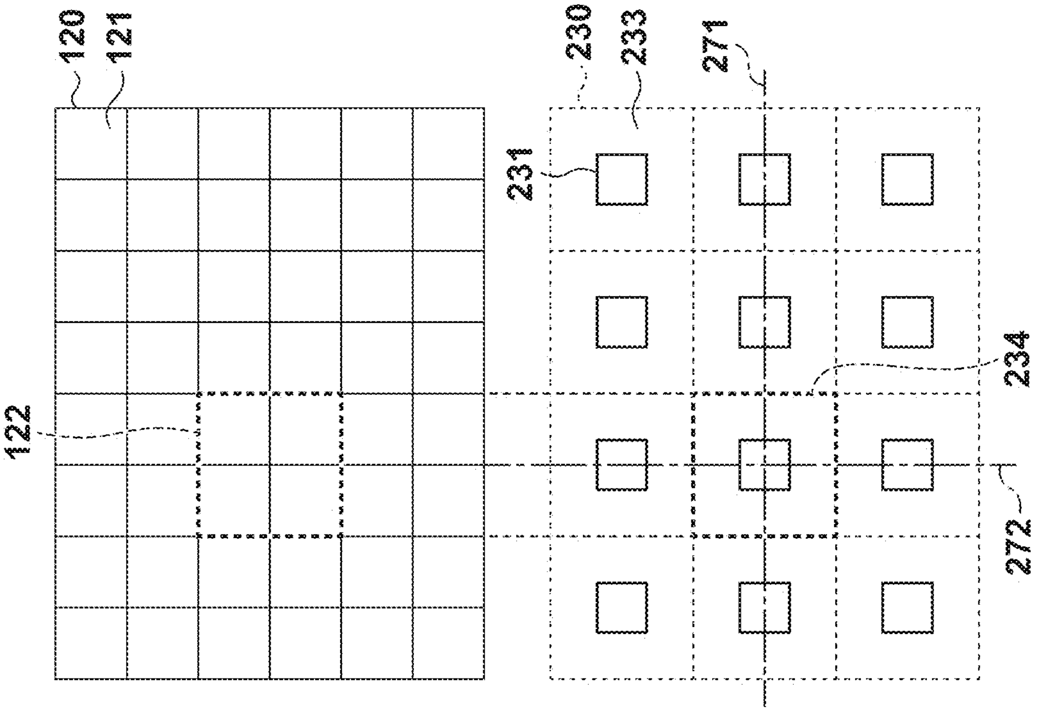

Each of FIGS. 6A and 6B shows the positional relationship among the light emitting element 121 to be driven at a given point of time and the areas 233 in each of which the temperature detector 231 is arranged in the light emitting device 13. In the light emitting area 120, there is a light emitting element group 122 including four light emitting elements 121 to be driven next. FIG. 6A shows a case in which the temperature detectors 231 (areas 233) are arranged as described above. That is, among the plurality of the temperature detectors 231, the temperature detectors 231 arranged on one virtual line 271 along the row direction are respectively arranged in the areas obtained by equally dividing the overlapping area 230 into (m/n) areas ((8/2) areas) in the row direction. Similarly, among the plurality of the temperature detectors 231, the temperature detectors 231 arranged on one virtual line 272 along the column direction are respectively arranged in the areas obtained by equally dividing the overlapping area 230 into (p/q) areas ((6/2) areas) in the column direction. At this time, in the orthogonal projection with respect to the main surface of the substrate 100 where the light emitting area 120 is arranged, an area 234 arranged with the temperature detector 231 overlapping the light emitting element group 122 to be driven next exists in the overlapping area 230. By arranging the temperature detectors 231 (areas 233) as described above, the area 234 arranged with the temperature detector 231 overlapping the light emitting element group 122 to be driven next is uniquely determined.

On the other hand, FIG. 6B shows a case, which is a counter example of FIG. 6A, in which the overlapping area 230 is equally divided into three areas in the row direction and two areas in the column direction. If the temperature detectors 231 (areas 233) are arranged in this manner, multiple areas 233 are included in the area overlapping the light emitting element group 122 to be driven, so the position of the light emitting element 121 to be driven next and the position of the area 233 closest to this light emitting element 121 are not determined uniquely.

That is, the number of the temperature detectors 231 (areas 233) is appropriately set as has been described above. With this, by simply counting the number of input times of the signal output control signals transmitted from the external system 20 to the signal output circuit 112, which indicates the number of drive times in the row direction, the control circuit 220 can select, as the selected temperature data 226, the temperature data 232 output from the temperature detector 231 close to the position of the light emitting element group 122 to be driven next.

In this manner, the control circuit 220 can generate the correction signal 221 in accordance with the temperature distribution generated in the light emitting area 120 of the substrate 100. Accordingly, the display quality in the light emitting device 13 can be improved. In addition, as has been described above, it is possible to obtain, with a simple circuit arrangement, the temperature data 232 output from the temperature detector 231 arranged at an appropriate position from the plurality of the temperature data 232 output from the plurality of the temperature detectors 231. That is, the cost of generating the correction signal 221 (calculating the temperature corrected coefficient) can be suppressed. As a result, detection of the temperature of the light emitting area 120 and correction of the drive signal to each light emitting element 121 arranged in the light emitting area 120 can be implemented with low cost.

It has been described with reference to FIG. 4 that four light emitting elements 121 including two light emitting elements 121 in the row direction and two light emitting elements 121 in the column direction are simultaneously driven, and the temperature detectors 231 (areas 233) are arranged so as to respectively correspond to the light emitting element groups 122 each formed by four light emitting elements 121. However, the present invention is not limited to this. For example, assume a case in which the light emitting element group 122 is similarly formed by four light emitting elements 121 including two light emitting elements 121 in the row direction and two light emitting elements 121 in the column direction. At this time, for example, one temperature detector 231 (area 233) may be arranged so as to correspond to four light emitting element groups 122 including two light emitting element groups 122 in the row direction and two light emitting element groups 122 in the column direction. It is only required that the temperature detectors 231 are arranged such that the light emitting element group 122 to be driven next and the temperature detector 231 are uniquely determined.

Application examples in which the light emitting device 10, 11, 12, or 13 according to this embodiment is applied to a display device, a photoelectric conversion device, an electronic apparatus, an illumination device, a moving body, and a wearable device will be described here with reference to FIGS. 7 to 13A and 13B. In the following description, an organic electroluminescence (EL) element is used as the light emitting element 121. In some cases, the light emitting element 121 is expressed as the “pixel”, and the light emitting area 120 is expressed as the “display area”. Details of the components of the above-described light emitting device 10, 11, 12, or 13 and modifications will be described first, and the application examples will be described after that.

Arrangement of Organic Light Emitting Element

The organic light emitting element is provided by forming an insulating layer, a first electrode, an organic compound layer, and a second electrode on a substrate. A protection layer, a color filter, a microlens, and the like may be provided on a cathode. If a color filter is provided, a planarizing layer can be provided between the protection layer and the color filter. The planarizing layer can be made of acrylic resin or the like. The same applies to a case in which a planarizing layer is provided between the color filter and the microlens.

Substrate

Quartz, glass, a silicon wafer, a resin, a metal, or the like may be used as a substrate. Furthermore, a switching element such as a transistor and a wiring may be provided on the substrate, and an insulating layer may be provided thereon. The insulating layer may be made of any material as long as a contact hole can be formed so that the wiring can be formed between the insulating layer and the first electrode and insulation from the unconnected wiring can be ensured. For example, a resin such as polyimide, silicon oxide, silicon nitride, or the like can be used.

Electrode

A pair of electrodes can be used as the electrodes. The pair of electrodes can be an anode and a cathode. If an electric field is applied in the direction in which the organic light emitting element emits light, the electrode having a high potential is the anode, and the other is the cathode. It can also be said that the electrode that supplies holes to the light emitting layer is the anode and the electrode that supplies electrons is the cathode.

As the constituent material of the anode, a material having a work function as large as possible may be used. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used.

One of these electrode materials may be used singly, or two or more of them may be used in combination. The anode may be formed by a single layer or a plurality of layers.

If the anode is used as a reflective electrode, for example, chromium, aluminum, silver, titanium, tungsten, molybdenum, an alloy thereof, a stacked layer thereof, or the like can be used. The above materials can function as a reflective film having no role as an electrode. If the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function may be used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multilayer structure. Among others, silver may be used. To suppress aggregation of silver, a silver alloy may be used. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but direct current sputtering or alternating current sputtering is suitable since the good film coverage is provided and the resistance is easily lowered.

Pixel Separating Layer

A pixel separating layer is formed of a silicon nitride (SiN) film, a silicon oxynitride (SiON) film, or a silicon oxide (SiO) film formed using a chemical vapor deposition method (CVD method). In order to increase the resistance in the in-plane direction of the organic compound layer, the organic compound layer, particularly, the hole transport layer can be deposited so as to have a small film thickness on the side wall of the pixel separating layer. More specifically, by increasing the taper angle of the side wall of the pixel separating layer or the film thickness of the pixel separating layer to increase vignetting during vapor deposition, the organic compound layer can be deposited so as to have a small film thickness on the side wall of the pixel separating layer.

On the other hand, the taper angle of the side wall of the pixel separating layer or the film thickness of the pixel separating layer may be adjusted to the extent not forming a gap in the protective layer formed on the pixel separating layer. If no gap is formed in the protective layer, generation of defects in the protective layer can be reduced. Since generation of defects in the protective layer is reduced, a decrease in reliability due to generation of a dark spot or occurrence of a conductive failure of the second electrode can be reduced.

According to this embodiment, even if the taper angle of the side wall of the pixel separating layer is not steep, it is possible to effectively suppress charge leakage to the adjacent pixel. The extensive studies have been made to find that the taper angle of 60° (inclusive) to 90° (inclusive) can sufficiently reduce charge leakage. The film thickness of the pixel separating layer may be 10 nm (inclusive) to 150 nm (inclusive). A similar effect can be obtained in an arrangement including only pixel electrodes without the pixel separating layer. However, in this case, it is suitable to set the film thickness of the pixel electrode to be equal to or smaller than half the film thickness of the organic layer, or set the end portion of the pixel electrode to have a forward taper of less than 60° to reduce short circuit of the organic light emitting element.

Also in a case in which the first electrode is the cathode and the second electrode is the anode, a high color gamut and low-voltage driving can be achieved by forming the electron transport material and charge transport layer satisfying conditional equation (1) and equation (2), and forming the light emitting layer on the charge transport layer.

Organic Compound Layer

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer can be arranged between the first and second electrodes, and may be arranged in contact with the first and second electrodes.

Protection Layer

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic compound layer. For example, the protection layer can be formed by forming the cathode, transferring it to another chamber without breaking the vacuum, and forming a silicon nitride film having a thickness of 2 μm by a CVD method. The protection layer may be provided using an atomic layer deposition method (ALD method) after forming a film using the CVD method. The material of the film by the ALD method is not limited but can be silicon nitride, silicon oxide, aluminum oxide, or the like. A silicon nitride film may further be formed by the CVD method on the film formed by the ALD method. The film formed by the ALD method may have a film thickness smaller than that of the film formed by the CVD method. More specifically, the film thickness of the film formed by the ALD method may be 50% or less, or 10% or less.

Color Filter

A color filter may be provided on the protection layer. For example, a color filter considering the size of the organic light emitting element may be provided on another substrate, and this substrate may be bonded to the substrate with the organic light emitting element provided thereon. Alternatively, a color filter may be patterned on the above-described protection layer using a photolithography technique. The color filter can be formed from a polymeric material.

Planarizing Layer

A planarizing layer may be provided between the color filter and the protection layer. The planarizing layer is provided to reduce unevenness of the lower layer. The planarizing layer may be called a material resin layer without limiting the purpose of the layer. The planarizing layer can be formed from an organic compound, and can be made of a low-molecular material or a polymeric material.

The planarizing layers may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

Microlens

The light emitting device can include an optical member such as a microlens on the light emission side. The microlens can be made of acrylic resin, epoxy resin, or the like. The microlens can aim to increase the amount of light extracted from the light emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircle of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

The microlens includes a first surface including a convex portion and a second surface opposite to the first surface. The second surface may be arranged on the functional layer side of the first surface. For this arrangement, the microlens is required to be formed on the light emitting device. If the functional layer is an organic layer, it is suitable to avoid a process which produces high temperature in the manufacturing step. In addition, if it is configured to arrange the second surface on the functional layer side of the first surface, all the glass transition temperatures of organic compound forming the organic layer may be 100° C. or more, and may be 130° C. or more.

Counter Substrate

A counter substrate can be provided on the planarizing layer. The counter substrate is called a counter substrate because it is provided at a position corresponding to the above-described substrate. The constituent material of the counter substrate can be the same as that of the above-described substrate. If the above-described substrate is the first substrate, the counter substrate can be the second substrate.

Organic Layer

The organic compound layer (hole injection layer, hole transport layer, electron blocking layer, light emitting layer, hole blocking layer, electron transport layer, electron injection layer, and the like) forming the organic light emitting element according to an embodiment of the present invention is formed by the method to be described below.

The organic compound layer forming the organic light emitting element according to the embodiment of the present invention can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

Pixel Circuit

The light emitting device can include a pixel circuit connected to the light emitting element. The pixel circuit may be an active matrix circuit that individually controls light emission of the first and second light emitting elements. The active matrix circuit may be a voltage or current programing circuit. A driving circuit includes a pixel circuit for each pixel. The pixel circuit can include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting device includes a display area and a peripheral area arranged around the display area. The light emitting device includes the pixel circuit in the display area and a display control circuit in the peripheral area. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

Pixel

The organic light emitting device includes a plurality of pixels. Each pixel includes sub-pixels that emit light components of different colors. The sub-pixels include, for example, R, G, and B emission colors, respectively.

In each pixel, an area also called a pixel opening emits light. This area is the same as the first area. The pixel opening can have a size of 5 μm (inclusive) to 15 μm (inclusive). More specifically, the pixel opening can have a size of 11 μm, 9.5 μm, 7.4 μm, 6.4 μm, or the like.

A distance between the sub-pixels can be 10 μm or less, and can be, more specifically, 8 μm, 7.4 μm, or 6.4 μm.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle, as a matter of course. The shape of the sub-pixel and the pixel arrangement can be used in combination.

Application of Organic Light Emitting Element of Embodiment of Present Invention The organic light emitting element according to an embodiment of the present invention can be used as a constituent member of a display device or an illumination device. In addition, the organic light emitting element is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

Details of application examples of the light emitting devices 10 to 13 will be described below with reference to FIGS. 7 to 13A and 13B.

Figure 7:
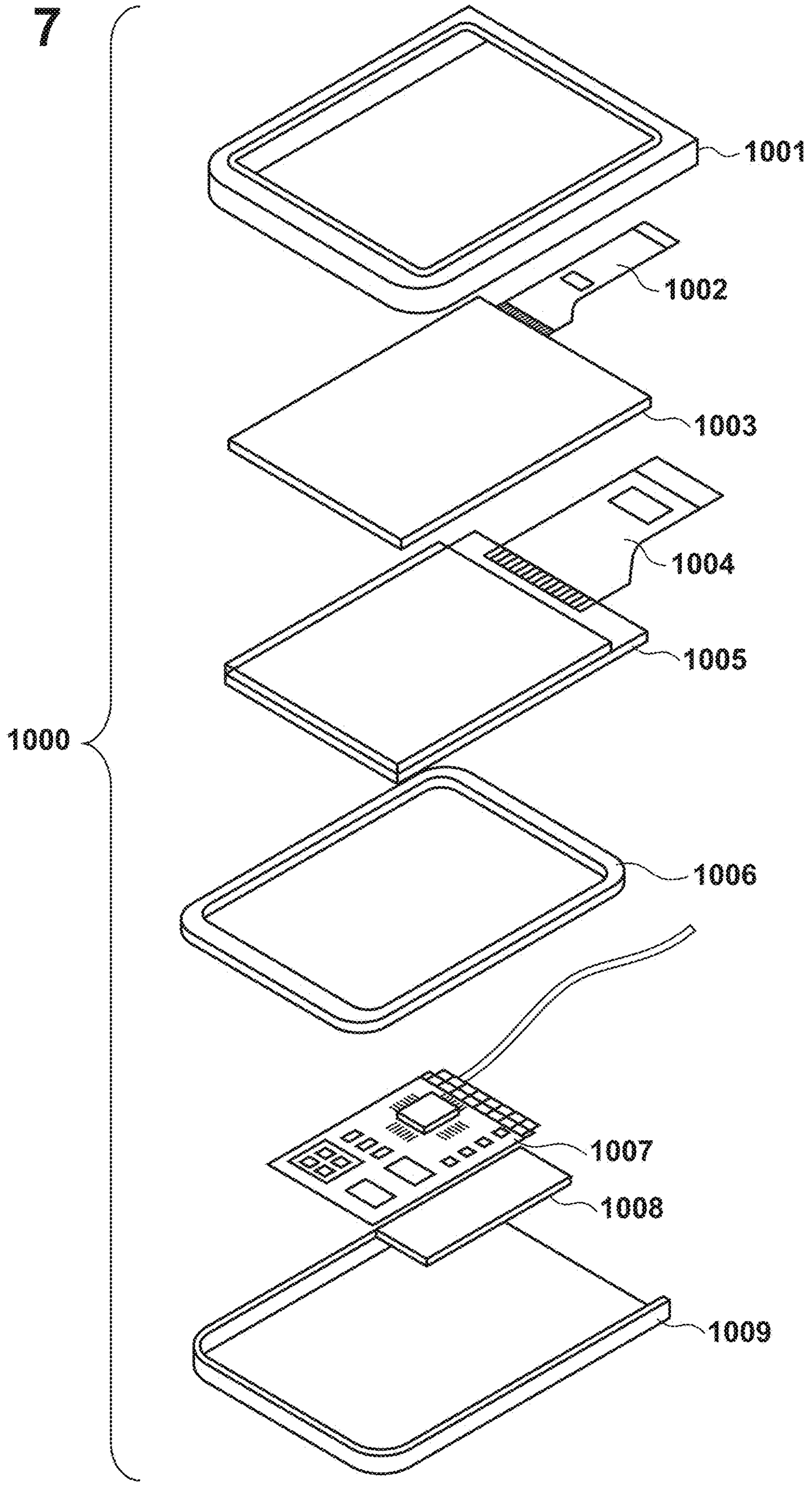
FIG. 7 is a view showing an example of a display device using the light emitting device according to the embodiment.

FIG. 7 is a schematic view showing an example of the display device using the light emitting device 10, 11, 12, or 13 of this embodiment. A display device 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are arranged on the circuit board 1007. The battery 1008 is unnecessary if the display device 1000 is not a portable apparatus. Even when the display device 1000 is a portable apparatus, the battery 1008 need not be provided at this position. The light emitting device 10, 11, 12, or 13 can be applied to the display panel 1005. The light emitting area 120 of the light emitting device 10, 11, 12, or 13 functioning as the display panel 1005 operates in a state in which it is connected to the active elements such as transistors arranged on the circuit board 1007.

The display device 1000 shown in FIG. 7 can be used for a display unit of a photoelectric conversion device (image capturing device) including an optical unit having a plurality of lenses, and an image sensor for receiving light having passed through the optical unit and photoelectrically converting the light into an electric signal. The photoelectric conversion device can include a display unit for displaying information acquired by the image sensor. In addition, the display unit can be either a display unit exposed outside the photoelectric conversion device, or a display unit arranged in the finder. The photoelectric conversion device can be a digital camera or a digital video camera.

Figure 8:
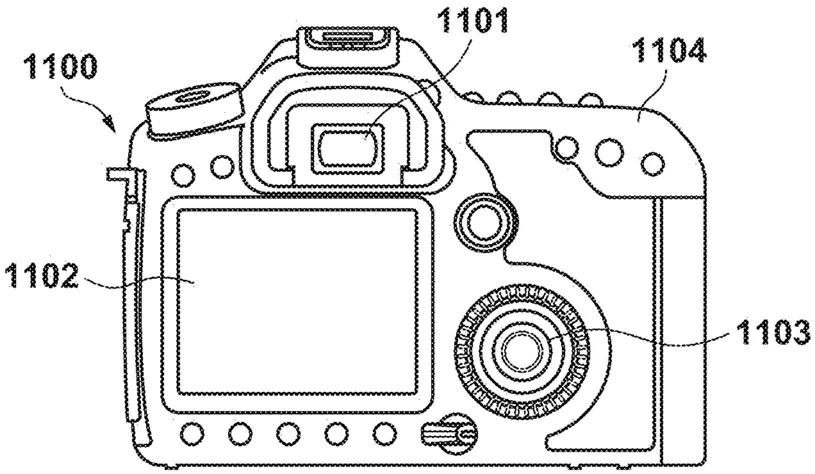
FIG. 8 is a view showing an example of a photoelectric conversion device using the light emitting device according to the embodiment.

FIG. 8 is a schematic view showing an example of the photoelectric conversion device using the light emitting device 10, 11, 12, or 13 of this embodiment. A photoelectric conversion device 1100 can include a viewfinder 1101, a rear display 1102, an operation unit 1103, and a housing 1104. The photoelectric conversion device 1100 can also be called an image capturing device. The light emitting device 10, 11, 12, or 13 according to the embodiment can be applied to the viewfinder 1101 or the rear display 1102 as a display unit. In this case, the light emitting area 120 of the light emitting device 10, 11, 12, or 13 can display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time in many cases, so the information should be displayed as soon as possible. Therefore, the light emitting device 10, 11, 12, or 13 in which the light emitting elements 121 such as organic EL elements using the organic light emitting material are arranged in the light emitting area 120 may be used for the viewfinder 1101 or the rear display 1102. This is so because the organic light emitting material has a high response speed. The light emitting device 10, 11, 12, or 13 using the organic light emitting material can be used for the apparatuses that require a high display speed more suitably than for the liquid crystal display device.

The photoelectric conversion device 1100 includes an optical unit (not shown). This optical unit has a plurality of lenses, and forms an image on a photoelectric conversion element (not shown) that receives light having passed through the optical unit and is accommodated in the housing 1104. The focal points of the plurality of lenses can be adjusted by adjusting the relative positions. This operation can also automatically be performed.

The light emitting device 10, 11, 12, or 13 may be applied to a display unit of an electronic apparatus. At this time, the display unit can have both a display function and an operation function. Examples of the portable terminal are a portable phone such as a smartphone, a tablet, and a head mounted display.

Figure 9:
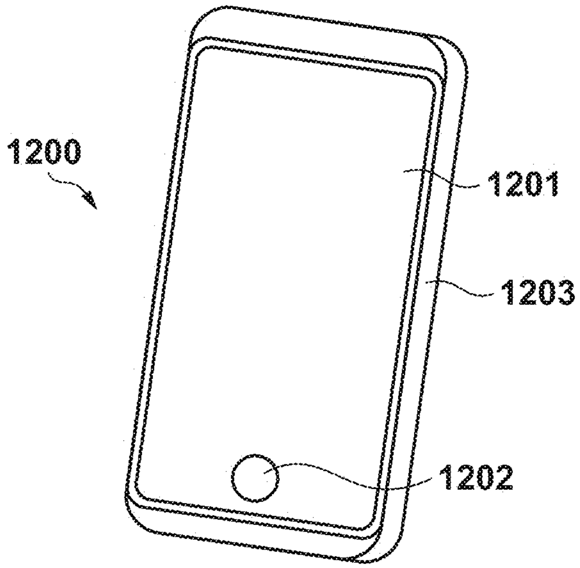
FIG. 9 is a view showing an example of an electronic apparatus using the light emitting device according to the embodiment.

FIG. 9 is a schematic view showing an example of an electronic apparatus using the light emitting device 10, 11, 12, or 13 of this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit 1202 can also be a biometric authentication unit that performs unlocking or the like by authenticating the fingerprint. The portable apparatus including the communication unit can also be regarded as a communication apparatus. The light emitting device 10, 11, 12, or 13 according to this embodiment can be applied to the display unit 1201.

Figure 10A:
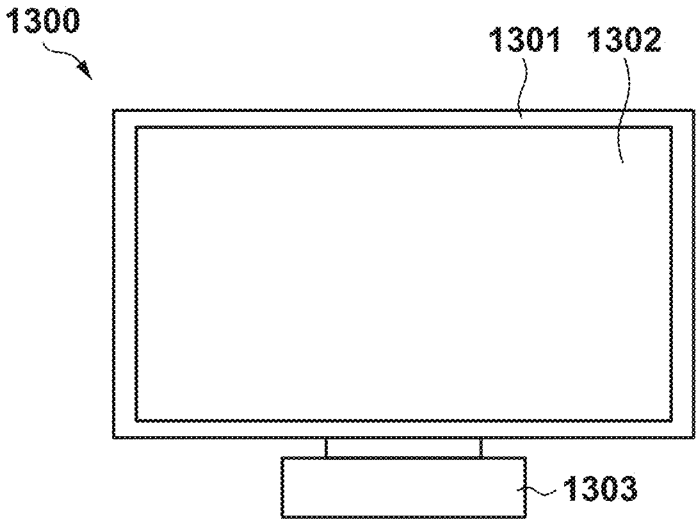
FIGS. 10A and 10B are views each showing an example of a display device using the light emitting device according to the embodiment.
Figure 10B:
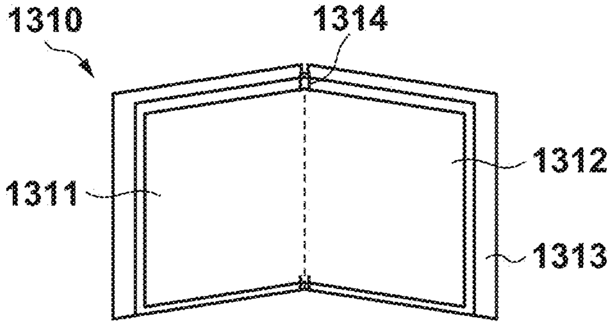

FIGS. 10A and 10B are schematic views showing examples of the display device using the light emitting device 10, 11, 12, or 13 of this embodiment. FIG. 10A shows a display device such as a television monitor or a PC monitor. A display device 1300 includes a frame 1301 and a display unit 1302. The light emitting device 10, 11, 12, or 13 according to this embodiment can be applied to the display unit 1302. The display device 1300 can include a base 1303 that supports the frame 1301 and the display unit 1302. The base 1303 is not limited to the form shown in FIG. 10A. For example, the lower side of the frame 1301 may also function as the base 1303. In addition, the frame 1301 and the display unit 1302 can be bent. The radius of curvature in this case can be 5,000 mm (inclusive) to 6,000 mm (inclusive).

FIG. 10B is a schematic view showing another example of the display device using the light emitting device 10, 11, 12, or 13 of this embodiment. A display device 1310 shown in FIG. 10B can be folded, and is a so-called foldable display device. The display device 1310 includes a first display unit 1311, a second display unit 1312, a housing 1313, and a bending point 1314. The light emitting device 10, 11, 12, or 13 according to this embodiment can be applied to each of the first display unit 1311 and the second display unit 1312. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 11:
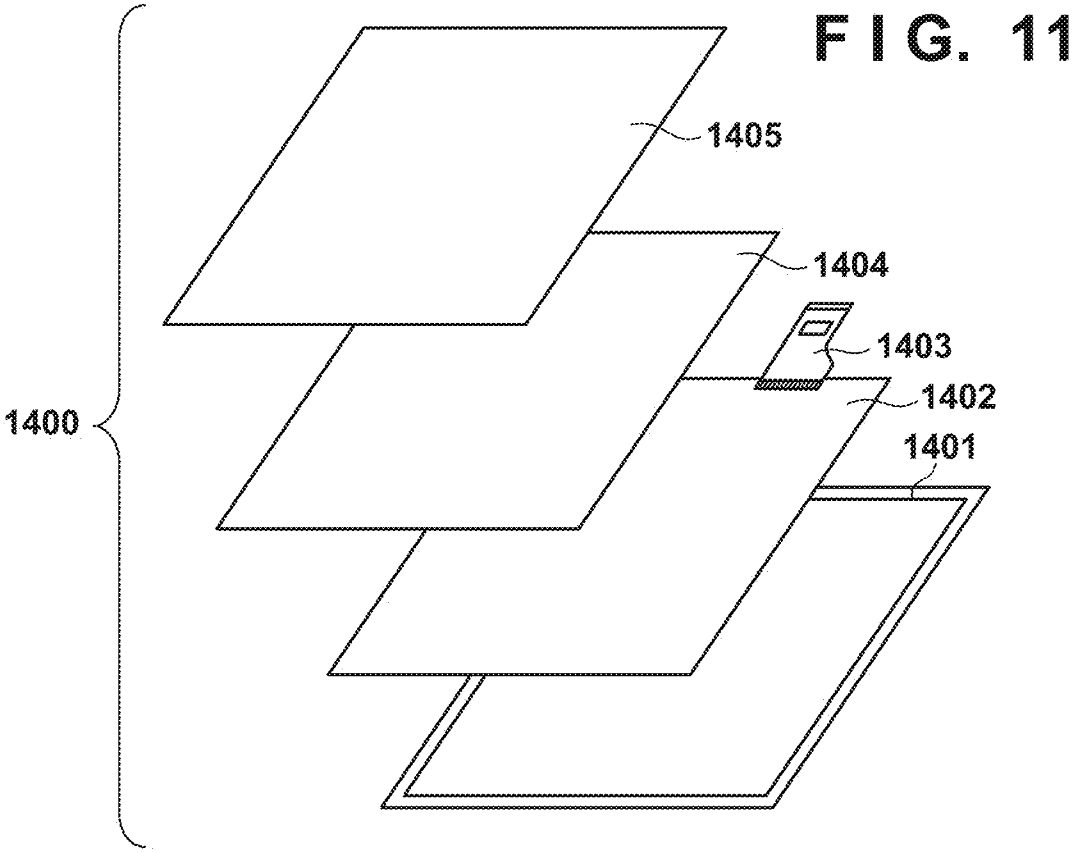
FIG. 11 is a view showing an example of an illumination device using the light emitting device according to the embodiment.

FIG. 11 is a schematic view showing an example of the illumination device using the light emitting device 10, 11, 12, or 13 of this embodiment. An illumination device 1400 can include a housing 1401, a light source 1402, a circuit board 1403, an optical film 1404, and a light diffusing unit 1405. The light emitting device 10, 11, 12, or 13 according to this embodiment can be applied to the light source 1402. The optical film 1404 can be a filter that improves the color rendering of the light source. When performing lighting-up or the like, the light diffusing unit 1405 can throw the light of the light source over a broad range by effectively diffusing the light. The illumination device can also include a cover on the outermost portion, as needed. The illumination device 1400 can include both or one of the optical film 1404 and the light diffusing unit 1405.

The illumination device 1400 is, for example, a device for illuminating the interior of the room. The illumination device 1400 can emit white light, natural white light, or light of any color from blue to red. The illumination device 1400 can also include a light control circuit for controlling these light components. The illumination device 1400 can also include a power supply circuit connected to the light emitting area 120 of the light emitting device 10, 11, 12, or 13 functioning as the light source 1402. The power supply circuit is a circuit for converting an AC voltage into a DC voltage. White has a color temperature of 4,200 K, and natural white has a color temperature of 5,000 K. The illumination device 1400 may also include a color filter. In addition, the illumination device 1400 can include a heat radiation unit. The heat radiation unit radiates the internal heat of the device to the outside of the device, and examples are a metal having a high specific heat and liquid silicon.

Figure 12:
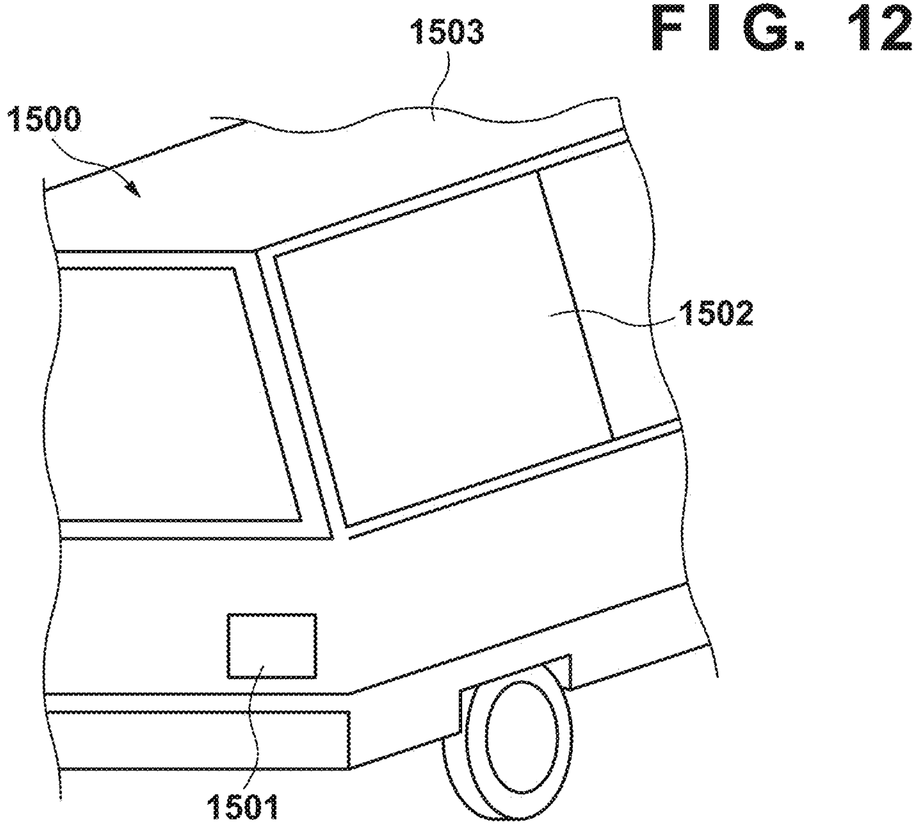
FIG. 12 is a view showing an example of a moving body using the light emitting device according to the embodiment.

FIG. 12 is a schematic view of an automobile having a taillight as an example of a vehicle lighting appliance using the light emitting device 10, 11, 12, or 13 of this embodiment. An automobile 1500 has a taillight 1501, and can have a form in which the taillight 1501 is turned on when performing a braking operation or the like. The light emitting device 10, 11, 12, or 13 of this embodiment can be used as a headlight serving as a vehicle lighting appliance. The automobile is an example of a moving body, and the moving body may be a ship, a drone, an aircraft, a railroad car, an industrial robot, or the like. The moving body may include a main body and a lighting appliance provided in the main body. The lighting appliance may be used to make a notification of the current position of the main body.

The light emitting device 10, 11, 12, or 13 according to this embodiment can be applied to the taillight 1501. The taillight 1501 can include a protection member for protecting the light emitting area 120 of the light emitting device 10, 11, 12, or 13 functioning as the taillight 1501. The material of the protection member is not limited as long as the material is a transparent material with a strength that is high to some extent, and an example is polycarbonate. The protection member may be made of a material obtained by mixing a furandicarboxylic acid derivative, an acrylonitrile derivative, or the like in polycarbonate.

The automobile 1500 can include a vehicle body 1503, and a window 1502 attached to the vehicle body 1503. This window can be a window for checking the front and back of the automobile, and can also be a transparent display. For this transparent display, the light emitting device 10, 11, 12, or 13 according to this embodiment may be used. In this case, the constituent materials of the electrodes and the like of the light emitting device 10, 11, 12, or 13 are formed by transparent members.

Figure 13A:
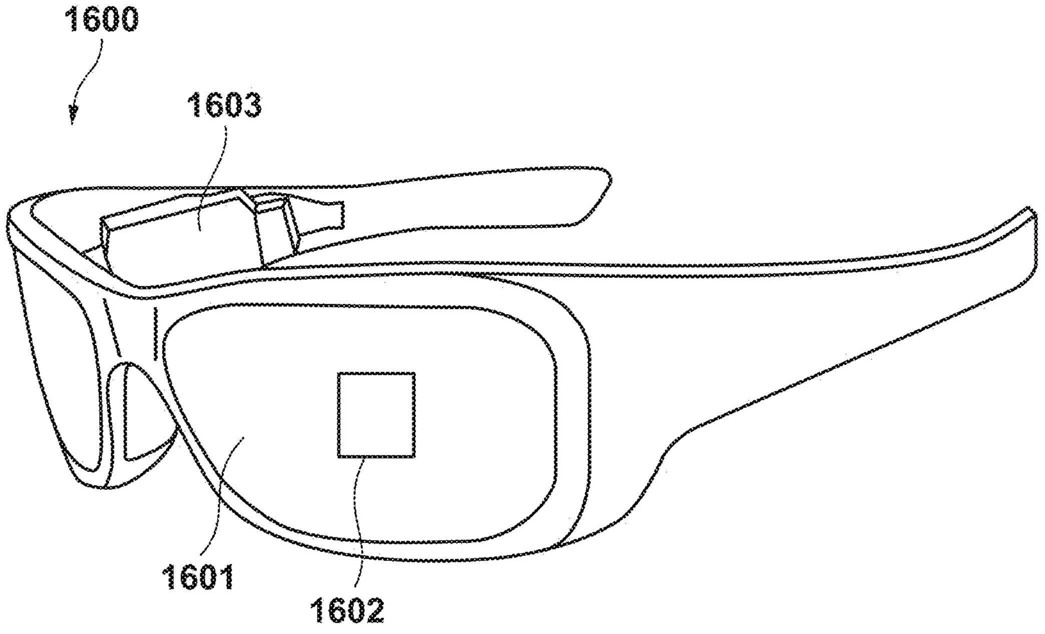
FIGS. 13A and 13B are views each showing an example of a wearable device using the light emitting device according to the embodiment.
Figure 13B:
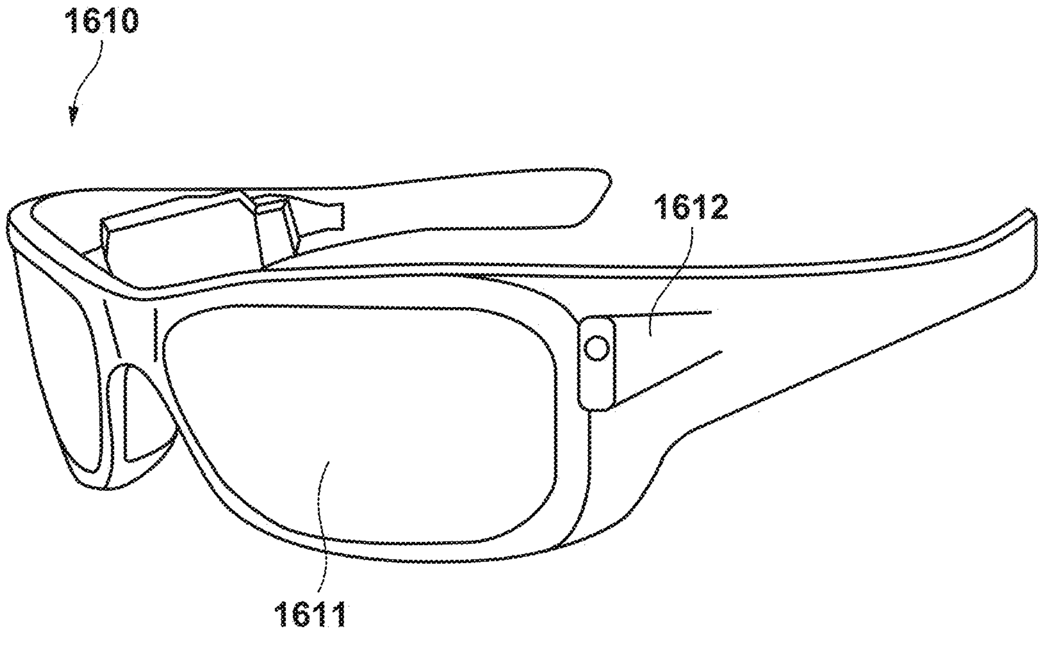

Further application examples of the light emitting device 10, 11, 12, or 13 according to this embodiment will be described with reference to FIGS. 13A and 13B. The light emitting device 10, 11, 12, or 13 can be applied to a system that can be worn as a wearable device such as smartglasses, a Head Mounted Display (HMD), or a smart contact lens. An image capturing display device used for such application examples includes an image capturing device capable of photoelectrically converting visible light and a light emitting device capable of emitting visible light.

Glasses 1600 (smartglasses) according to one application example will be described with reference to FIG. 13A. An image capturing device 1602 such as a CMOS sensor or an SPAD is provided on the front surface side of a lens 1601 of the glasses 1600. In addition, the light emitting device 10, 11, 12, or 13 according to this embodiment is provided on the back surface side of the lens 1601.

The glasses 1600 further include a control device 1603. The control device 1603 functions as a power supply that supplies electric power to the image capturing device 1602 and the light emitting device 10, 11, 12, or 13 according to each embodiment. In addition, the control device 1603 controls the operations of the image capturing device 1602 and the light emitting device 10, 11, 12, or 13. An optical system configured to condense light to the image capturing device 1602 is formed on the lens 1601.

Glasses 1610 (smartglasses) according to one application example will be described with reference to FIG. 13B. The glasses 1610 include a control device 1612, and an image capturing device corresponding to the image capturing device 1602 and the light emitting device 10, 11, 12, or 13 are mounted on the control device 1612. The image capturing device in the control device 1612 and an optical system configured to project light emitted from the light emitting device 10, 11, 12, or 13 are formed in a lens 1611, and an image is projected to the lens 1611. The control device 1612 functions as a power supply that supplies electric power to the image capturing device and the light emitting device 10, 11, 12, or 13, and controls the operations of the image capturing device and the light emitting device 10, 11, 12, or 13. The control device 1612 may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The light emitting device 10, 11, 12, or 13 according to the embodiment of the present invention can include an image capturing device including a light receiving element, and control a displayed image based on the line-of-sight information of the user from the image capturing device.

More specifically, the light emitting device 10, 11, 12, or 13 decides a first visual field area at which the user is gazing and a second visual field area other than the first visual field area based on the line-of-sight information. The first visual field area and the second visual field area may be decided by the control device of the light emitting device 10, 11, 12, or 13, or those decided by an external control device may be received. In the light emitting area of the light emitting device 10, 11, 12, or 13, the display resolution of the first visual field area may be controlled to be higher than the display resolution of the second visual field area. That is, the resolution of the second visual field area may be lower than that of the first visual field area.

In addition, the display area includes a first display area and a second display area different from the first display area, and an area of higher priority is decided from the first display area and the second display area based on line-of-sight information. The first display area and the second display area may be decided by the control device of the light emitting device 10, 11, 12, or 13, or those decided by an external control device may be received. The resolution of the area of higher priority may be controlled to be higher than the resolution of the area other than the area of higher priority. That is, the resolution of the area of relatively low priority may be low.

Note that AI may be used to decide the first visual field area or the area of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the light emitting device 10, 11, 12, or 13, the image capturing device, or an external device. If the external device holds the AI program, it is transmitted to the light emitting device 10, 11, 12, or 13 via communication.

When performing display control based on line-of-sight detection, smartglasses further including an image capturing device configured to capture the outside can be applied. The smartglasses can display captured outside information in real time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-095221, filed Jun. 13, 2022 which is hereby incorporated by reference herein in its entirety.

What is claimed is:

1. A light-emitting device comprising:
a first semiconductor substrate including a light-emitting area where a plurality of light-emitting elements are arranged; and
a second semiconductor substrate stacked with the first semiconductor substrate,
wherein the second semiconductor substrate includes a plurality of temperature detectors configured to detect a temperature of the first semiconductor substrate, and
wherein the plurality of temperature detectors are disposed at an overlapping area of the second semiconductor substrate overlapping the light-emitting area of the first semiconductor substrate.

2. The light-emitting device according to claim 1, further comprising:
a drive circuit configured to generate, from a video signal input to the light-emitting device, a drive signal for driving the plurality of light-emitting elements; and
a control circuit configured to generate a correction signal corresponding to temperature data detected by the first temperature detector,
wherein the drive circuit is configured to correct the drive signal in accordance with the correction signal input from the control circuit.

3. The light-emitting device according to claim 1, wherein a temperature detector of the plurality of temperature detectors is arranged in a central portion of the overlapping area.

4. The light-emitting device according to claim 1, wherein the first semiconductor substrate does not have a temperature detector.

5. The light-emitting device according to claim 2, wherein the control circuit is configured to generate the correction signal in accordance with a plurality of temperature data detected by the plurality of temperature detectors.

6. The light-emitting device according to claim 5, wherein the control circuit is configured to generate the correction signal based on an average value of the plurality of temperature data detected by the plurality of temperature detectors.

7. The light-emitting device according to claim 5, wherein the control circuit is configured to generate the correction signal based on, among a plurality of temperature data detected by the plurality of temperature detectors, temperature data corresponding to a position of a light-emitting element for which the drive circuit generates the drive signal.

8. The light-emitting device according to claim 1, wherein the plurality of light-emitting elements are arranged in the light-emitting area so as to form rows and columns, and
wherein among the plurality of temperature detectors, temperature detectors arranged on one virtual line along a row direction are arranged at a constant pitch.

9. The light-emitting device according to claim 8, wherein among the plurality of temperature detectors, temperature detectors arranged on one virtual line along a column direction are arranged at a constant pitch.

10. The light-emitting device according to claim 1, wherein the plurality of light-emitting elements are arranged in the light-emitting area so as to form rows and columns, and
wherein the plurality of temperature detectors includes two temperature detectors arranged at positions line-symmetric with respect to a virtual line extending in a row direction and halving the overlapping area.

11. The light-emitting device according to claim 10, wherein the plurality of temperature detectors includes two temperature detectors arranged at positions line-symmetric with respect to a virtual line extending in a column direction and halving the overlapping area.

12. The light-emitting device according to claim 10, wherein the plurality of temperature detectors includes a temperature detector arranged in a central portion of the overlapping area.

13. The light-emitting device according to claim 1, wherein the plurality of temperature detectors includes five temperature detectors arranged in a central portion and four corners of the overlapping area.

14. The light-emitting device according to claim 7, wherein the plurality of light-emitting elements are arranged in the light-emitting area so as to form rows and columns, wherein a number of light-emitting elements arranged in a row direction in the light-emitting area is m, wherein the drive circuit is configured to simultaneously supply the drive signal to light-emitting elements whose number is n in the row direction, and wherein among the plurality of temperature detectors, temperature detectors arranged on one virtual line along the row direction are respectively arranged in areas obtained by equally dividing the overlapping area into (m/n) areas in the row direction.

15. The light-emitting device according to claim 14, wherein among the plurality of temperature detectors, the temperature detectors arranged on the one virtual line along the row direction are arranged at a constant pitch.

16. The light-emitting device according to claim 14, wherein a number of light-emitting elements arranged in a column direction in the light-emitting area is p, wherein the drive circuit simultaneously supplies the drive signal to light-emitting elements whose number is q in the column direction, and wherein among the plurality of temperature detectors, temperature detectors arranged on one virtual line along the column direction are respectively arranged in areas obtained by equally dividing the overlapping area into (p/q) areas in the column direction.

17. The light-emitting device according to claim 16, wherein among the plurality of temperature detectors, the temperature detectors arranged on the one virtual line along the column direction are arranged at a constant pitch.

18. A display device comprising:

the light-emitting device according to claim 1; and an active element connected to the light-emitting device.

19. A photoelectric conversion device comprising:

an optical unit including a plurality of lenses;

an image sensor configured to receive light having passed through the optical unit; and a display unit configured to display an image, wherein the display unit is a display unit that displays an image captured by the image sensor, and that includes the light-emitting device according to claim 1.

20. An electronic apparatus comprising:

a housing provided with a display unit; and a communication unit provided in the housing and configured to perform external communication, wherein the display unit includes a light-emitting device comprising:

a first semiconductor substrate including a light-emitting area where a plurality of light-emitting elements are arranged; and a second semiconductor substrate stacked with the first semiconductor substrate, wherein the second semiconductor substrate includes a temperature detector configured to detect a temperature of the first semiconductor substrate, and wherein the temperature detector is disposed at an overlapping area of the second semiconductor substrate overlapping the light-emitting area of the first semiconductor substrate.

* * * * *